United States Patent
Chen et al.

(10) Patent No.: US 10,215,812 B2
(45) Date of Patent: Feb. 26, 2019

(54) CLAMP-TYPE PROBE DEVICE

(71) Applicant: CHROMA ATE INC., Taoyuan (TW)

(72) Inventors: Peng-Fei Chen, Taoyuan (TW); Mao-Sheng Liu, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 157 days.

(21) Appl. No.: 15/604,602

(22) Filed: May 24, 2017

(65) Prior Publication Data

US 2018/0011146 A1   Jan. 11, 2018

(30) Foreign Application Priority Data

Jul. 11, 2016   (TW) .............................. 105121748 A

(51) Int. Cl.
| | | |
|---|---|---|
| *G01R 31/36* | (2006.01) | |
| *G01R 1/067* | (2006.01) | |
| *G01R 1/02* | (2006.01) | |

(52) U.S. Cl.
CPC ........... *G01R 31/3644* (2013.01); *G01R 1/02* (2013.01); *G01R 1/067* (2013.01); *G01R 1/06788* (2013.01)

(58) Field of Classification Search
CPC ...... G01R 31/3644; G01R 1/02; G01R 1/067; G01R 1/06788
USPC ................................................ 324/426–437
See application file for complete search history.

(56) References Cited

U.S. PATENT DOCUMENTS

| 4,439,736 A * | 3/1984 | Schwartz | G01R 1/02 324/435 |
|---|---|---|---|
| 5,921,786 A * | 7/1999 | Slocum | G01R 1/0466 439/67 |
| 7,338,294 B2 * | 3/2008 | Polnyi | H01R 13/2421 439/66 |
| 2013/0009660 A1 * | 1/2013 | Fan | G01R 1/0408 324/756.05 |
| 2013/0082695 A1 * | 4/2013 | Johnson | G01R 15/207 324/243 |

* cited by examiner

*Primary Examiner* — Jeff W Natalini
(74) *Attorney, Agent, or Firm* — Maschoff Brennan

(57) ABSTRACT

A clamp-type probe device comprises a first pressed member, a second pressed member and a probe head. The first pressed member comprises a first clamping portion and a first mounted portion connected to each other, and has a first and a second assembly holes. The second pressed member comprises a second clamping portion and a second mounted portion connected to each other. The second and the first mounted portions are connected to each other. The second and the first clamping portions are separated from each other. The probe head comprises a plurality of contacting members. Each contacting member comprises two bending portions. Two ends of each contacting member are respectively disposed through the first and the second assembly holes. The two bending portions are respectively pressed against an inner side surface of the first assembly hole and an inner side surface of the second assembly hole.

10 Claims, 10 Drawing Sheets

CLAMP-TYPE PROBE DEVICE

CROSS-REFERENCE TO RELATED APPLICATIONS

This non-provisional application claims priority under 35 U.S.C. § 119(a) on Patent Application No(s). 105121748 filed in Taiwan, R.O.C. on Jul. 11, 2016, the entire contents of which are hereby incorporated by reference.

TECHNICAL FIELD

The disclosure relates to a clamp-type probe device, more particularly to a clamp-type probe device for testing electrical components.

BACKGROUND

Electronic devices should be tested after being manufactured in order to increase the manufacturing yield and to ensure reliability. To ensure performance, pouch-type batteries will undergo a charge/discharge test by a clamp-type probe device before being sold.

SUMMARY

The present disclosure provides a clamp-type probe device.

One embodiment of the disclosure provides a clamp-type probe device comprising a first pressed member, a second pressed member and a probe head. The first pressed member comprises a first clamping portion and a first mounted portion connected to each other. The first pressed member has a first assembly hole and a second assembly hole. The second pressed member comprises a second clamping portion and a second mounted portion connected to each other. The second mounted portion and the first mounted portion are connected to each other. The second clamping portion and the first clamping portion are separated from each other. The probe head comprises a plurality of contacting members. Each of the plurality of contacting members comprises two bending portions connected to each other. Two ends of each of the plurality of contacting members, which are opposite to each other, are respectively disposed through the first assembly hole and the second assembly hole. The two bending portions of each of the plurality of contacting members are respectively pressed against an inner side surface of the first assembly hole and an inner side surface of the second assembly hole.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1A:
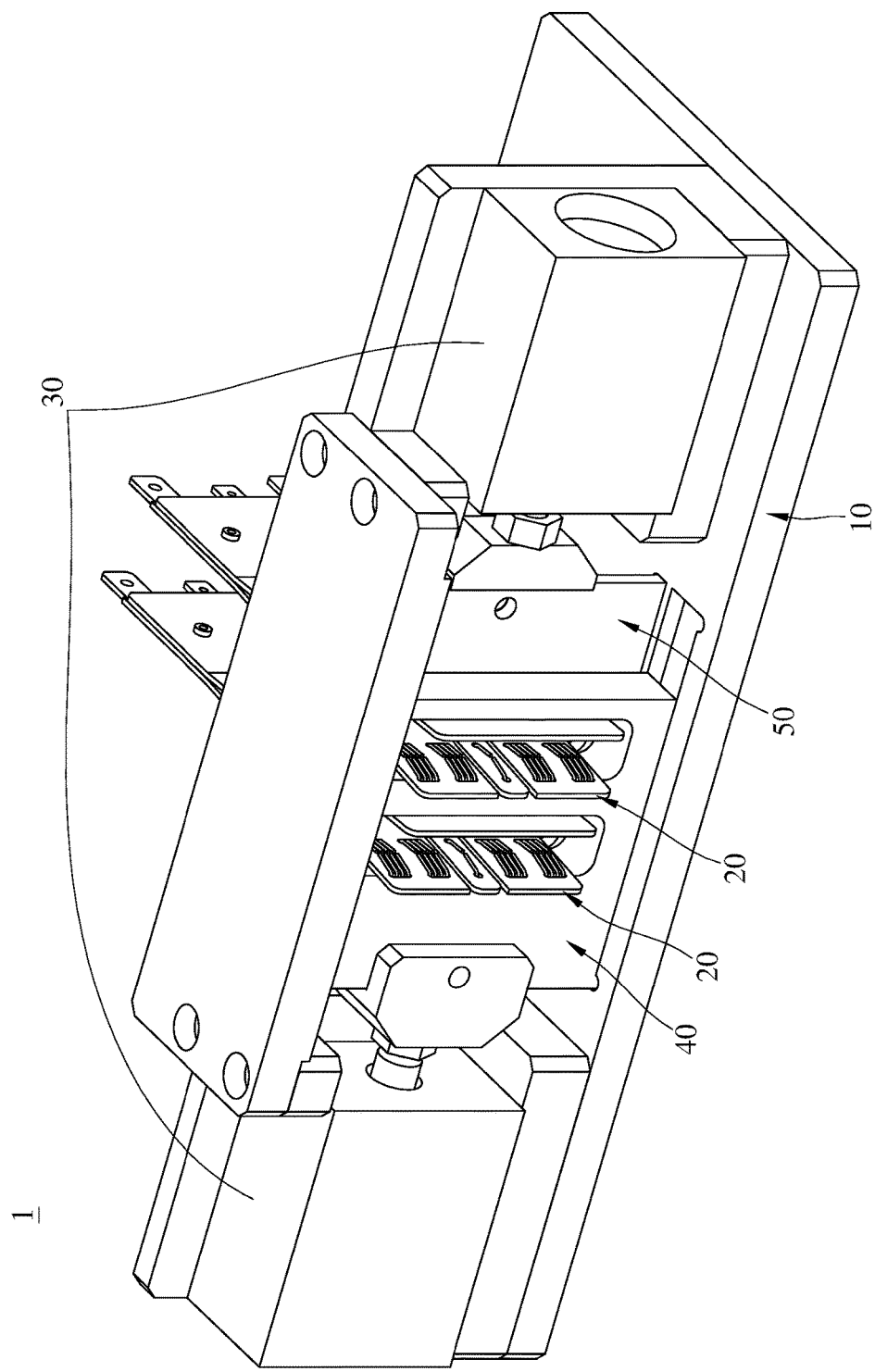
FIG. 1A is a perspective view of a clamp-type probe device in accordance with a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
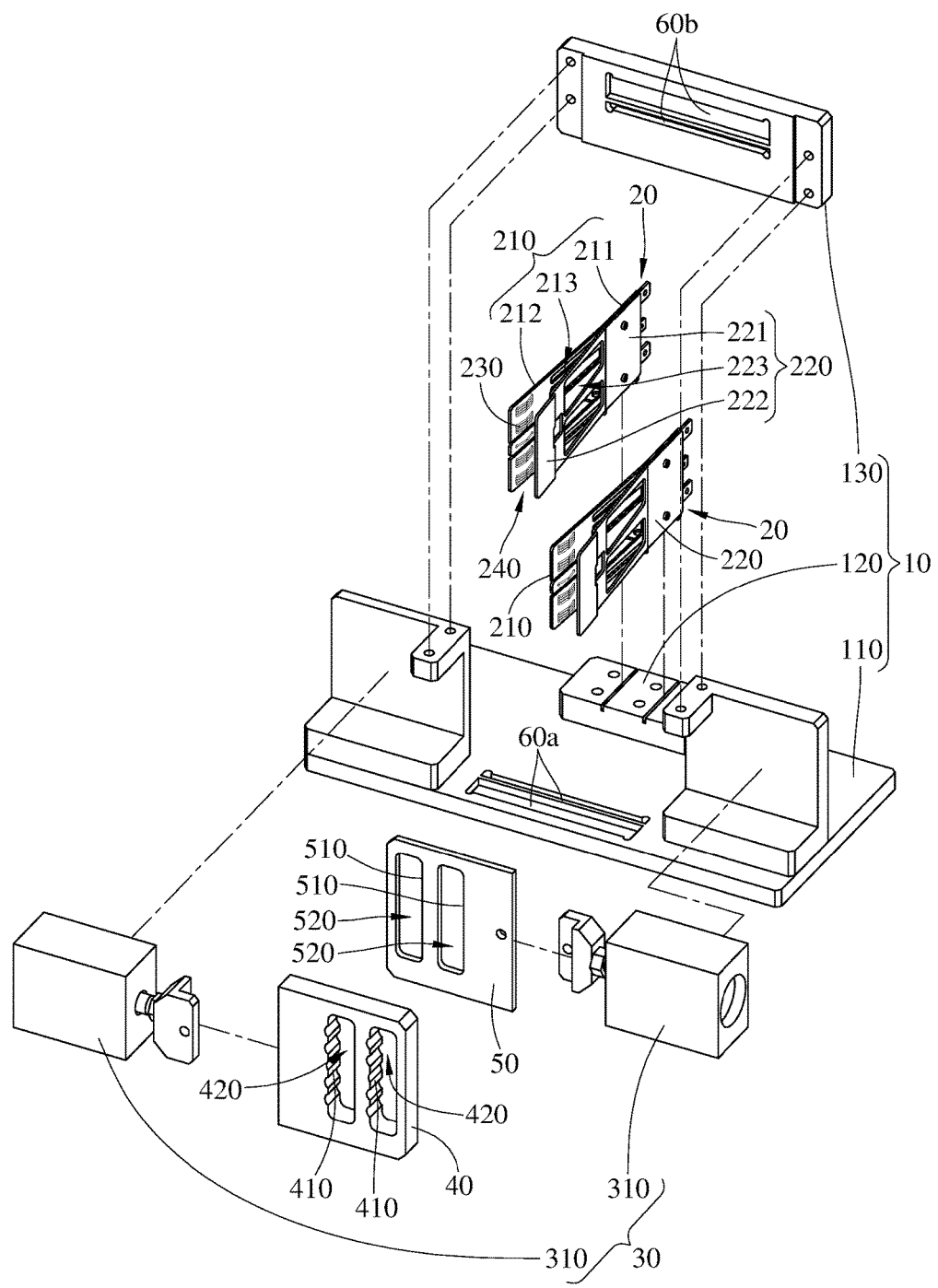
FIG. 1B is an exploded view of the clamp-type probe device in FIG. 1A.
Figure 1C:
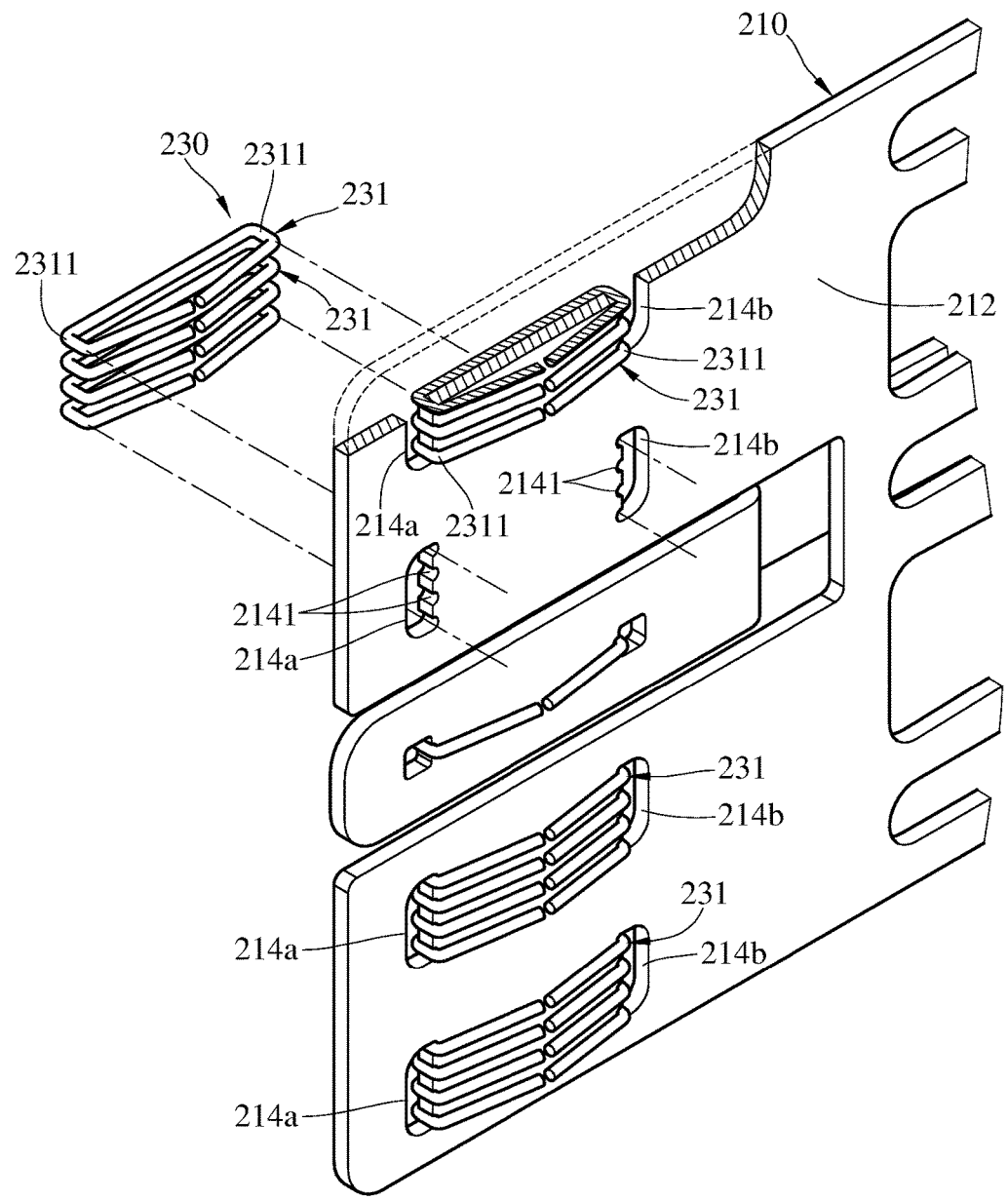
FIG. 1C is a partial enlarged exploded perspective view of a pressed member of the clamp-type probe device in FIG. 1A.
Figure 1D:
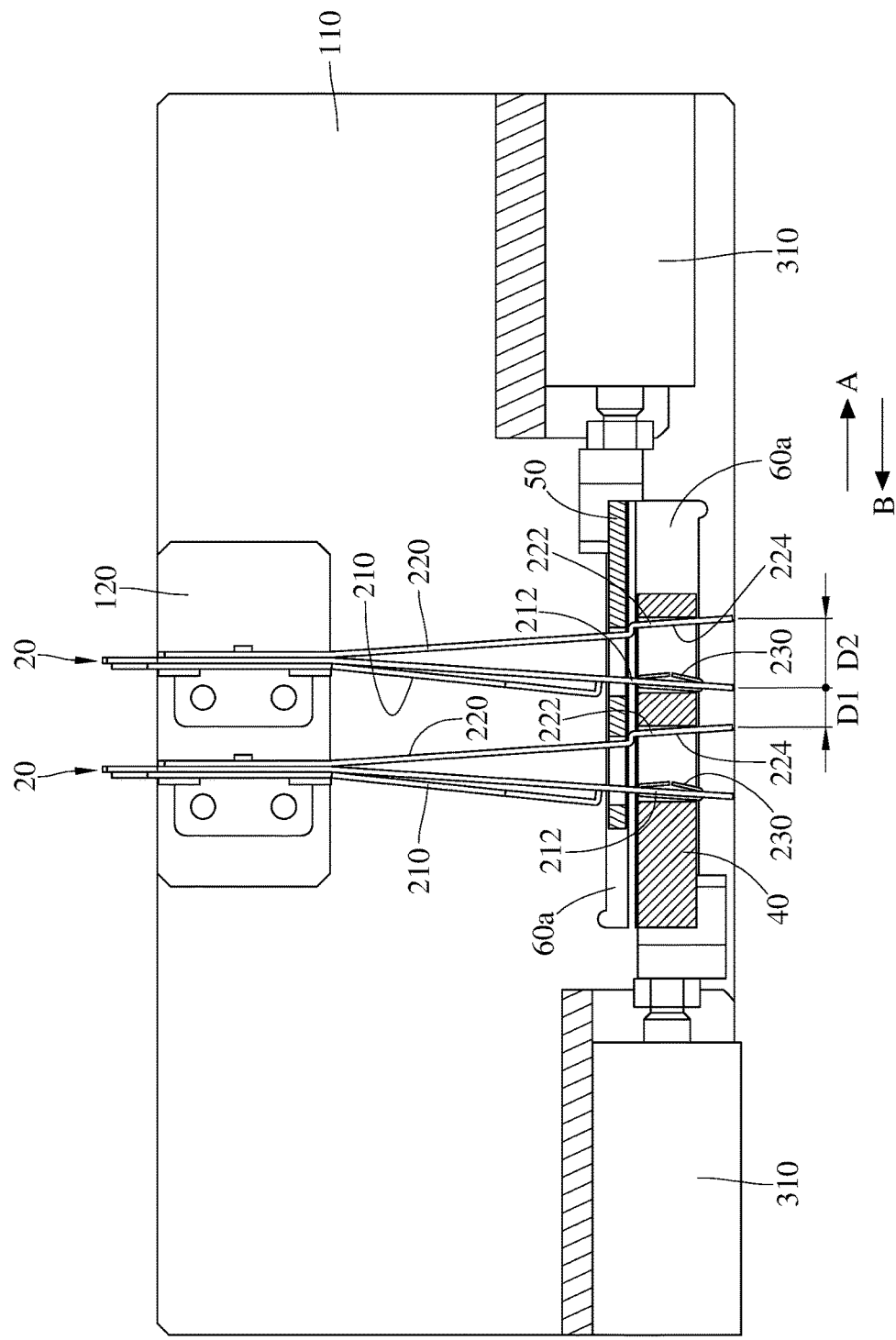
FIG. 1D is a cross-sectional view of the clamp-type probe device in FIG. 1A.

Please refer to FIG. 1A to FIG. 1D. FIG. 1A is a perspective view of a clamp-type probe device in accordance with a first embodiment of the disclosure. FIG. 1B is an exploded view of the clamp-type probe device in FIG. 1A. FIG. 1C is a partial enlarged exploded perspective view of a pressed member of the clamp-type probe device in FIG. 1A. FIG. 1D is a cross-sectional view of the clamp-type probe device in FIG. 1A. In this embodiment, a clamp-type probe device 1 includes a base 10, two probe assemblies 20, a power source 30, a first pushing member 40 and a second pushing member 50.

The base 10 includes a carrier 110 and an electrically insulating member 120. The electrically insulating member 120 is fixed to the carrier 110, but the present disclosure is not limited thereto. In other embodiments, the base 10 may not include the electrically insulating member 120, but is coated with an electrically insulating material to prevent electrical leakage.

Each of the probe assemblies 20 includes a first pressed member 210, a second pressed member 220 and a probe head 230. The first pressed member 210 includes a first mounted portion 211 and a first clamping portion 212 connected to each other. The second pressed member 220 includes a second mounted portion 221 and a second clamping portion 222 connected to each other. The first mounted portions 211 and the second mounted portions 221 are fixed to the electrically insulating member 120. In other words, the first pressed members 210 and the second pressed members 220 are fixed to the carrier 110 through the electrically insulating member 120. In each probe assembly 20, the first clamping portion 212 and the second clamping portion 222 face each other. The probe head 230 includes a plurality of contacting members 231 disposed on the first clamping portion 212, and a part of each of the contacting members 231 is located between the first clamping portion 212 and the second clamping portion 222. The probe head 230 and the second clamping portion 222 are separated from each other, and together form an opening 240.

In addition, in this embodiment, as shown in FIG. 1D, a distance D1 between the first clamping portion 212 of one of the probe assemblies 20 and the second clamping portion 222 of the other probe assembly 20 is 2.0 millimeters (mm), and a maximum distance D2 between the first clamping portion 212 and the second clamping portion 222 of each probe assembly 20 is 16.5 mm. However, the present disclosure is not limited thereto. In some embodiments, the distance D1 may be less than or equal to 2.0 mm, and the distance D2 may be greater than or equal to 16.5 mm. Further, in some embodiments, the distance D1 may be greater than 2.0 mm, and the distance D2 may be less than 16.5 mm.

The power source 30 includes, for example, a plurality of pneumatic drive units, hydraulic drive units or motors. In this embodiment, the power source 30 includes two pneumatic drive units 310, and each pneumatic drive unit 310 includes, for example, a cylinder and a piston. The pneumatic drive units 310 are disposed on the carrier 110 of the base 10, and are respectively located on two opposite sides of the probe assemblies 20.

The first pushing member 40 is connected to one of the pneumatic drive units 310 of the power source 30. The first pushing member 40 has two first edges 410. In detail, in this embodiment, the first pushing member 40 has two first through holes 420, and the two first edges 410 are respectively located on at least a part of inner side surfaces of the first through holes 420. The second pushing member 50 is connected to the other pneumatic drive unit 310 of the power source 30. The second pushing member 50 has two second edges 510. In detail, in this embodiment, the second pushing member 50 has two second through holes 520, and the two second edges 510 are respectively located on at least a part of inner side surfaces of the second through holes 520. The probe assemblies 20 are located between the first edges 410 of the first pushing member 40 and the second edges 510 of the second pushing member 50. In detail, the two probe assemblies 20 are respectively disposed through the two first through holes 420 of the first pushing member 40, and also respectively disposed through the two second through holes 520 of the second pushing member 50. The two pneumatic drive units 310 of the power source 30 are able to move the first pushing member 40 and the second pushing member 50, respectively, so that the first pressed members 210 and the second pressed members 220 are able to be pressed by the first edges 410 of the first pushing member 40 and the second edges 510 of the second pushing member 50, respectively. In detail, as shown in FIG. 1D, the power source 30 is able to move the first pushing member 40 in a first direction A to press the first pressed members 210 of the probe assemblies 20, and move the second pushing member 50 in a second direction B, which is opposite to the first direction A, to press the second pressed members 220 of the probe assemblies 20.

In this embodiment, the quantity of the probe assemblies 20 is two, the first pushing member 40 has the same quantity of the first through holes 420 as that of the probe assemblies 20, and the second pushing member 50 has the same quantity of the second through holes 520 as that of the probe assemblies 20, but the present disclosure is not limited to the quantities of the probe assemblies 20, the first through holes 420 and the second through holes 520. In addition, in this embodiment, the first edges 410 are respectively formed in the through holes 420 of the first pushing member 40, and the second edges 510 are respectively formed in the through holes 520 of the second pushing member 50, but the present disclosure is not limited thereto. In some embodiments, in the case that the quantity of the probe assemblies 20 is plural, the first pushing member 40 and the second pushing member 50 may have a plurality of recesses but not a through hole; in such a case, the first edges 410 are located on at least a part of inner side surfaces of the recesses of the first pushing member 40, the second edges 510 are located on at least a part of inner side surfaces of the recesses of the second pushing member 50, and the probe assemblies 20 are able to penetrate through the recesses. In some embodiments, in the case that the quantity of the probe assembly 20 is singular, the first pushing member 40 and the second pushing member 50 may not have a through hole; in this case, the first edge 410 is located on a side of the first pushing member 40 facing the probe assembly 20, and the second edge 510 is located on a side of the second pushing member 50 facing the probe assembly 20.

In this embodiment, the clamp-type probe device 1 further includes two guiding grooves 60a and two guiding grooves 60b, which are disposed on the base 10. In detail, the base 10 further includes a guiding seat 130. The two guiding grooves 60a are disposed on the carrier 110 of the base 10, and the two guiding grooves 60b are disposed on the guiding seat 130. The first pushing member 40 and the second pushing member 50 are located between the carrier 110 and the guiding seat 130. Two opposite sides of the first pushing member 40 are respectively disposed in one of the guiding grooves 60a of the carrier 110 and one of the guiding grooves 60b of the guiding seat 130. Two opposite sides of the second pushing member 50 are respectively disposed in the other guiding groove 60a of the carrier 110 and the other guiding groove 60b of the guiding seat 130. In this embodiment, the guiding grooves 60a, 60b are respectively disposed on the carrier 110 and the guiding seat 130, but the present disclosure is not limited thereto. In other embodiments, the base 10 may not include the guiding seat 130, but only include the carrier 110 with one or the two guiding grooves 60a disposed thereon.

In addition, in this embodiment, the first pressed member 210 has a hollow structure 213, and the second pressed member 220 has a hollow structure 223. In detail, in this embodiment, the hollow structures 213, 223 are a plurality of openings. The openings of the first pressed member 210 are located between the first mounted portion 211 and the first clamping portion 212, and the openings of the second pressed member 220 are located between the second mounted portion 221 and the second clamping portion 222.

Moreover, in this embodiment, each second pressed member 220 further has an inclined guiding surface 224. The inclined guiding surface 224 is located at the second clamping portion 222, and faces the first clamping portion 212 of the first pressed member 210.

In this embodiment, each first pressed member 210 further has a plurality of assembly holes 214a, 214b located at one end of the first pressed member 210. In detail, as shown in FIG. 1C, the plurality of assembly holes 214a located on the first clamping portion 212 are arranged in a line, and the plurality of assembly holes 214b located on the first clamping portion 212 are arranged in another line. One of the assembly holes 214a and one of the assembly holes 214b, which are aligned with each other, are considered to be a pair of holes. Each of the contacting members 231 of the probe head 230 includes two bending portions 2311 connected to each other. Two opposite ends of each contacting member 231 are respectively disposed through one of the pairs of the assembly holes 214a, 214b. When the contacting member 231 is disposed through the assembly holes 214a, 214b, the two bending portions 2311 are respectively pressed against inner side surfaces of the assembly hole 214a and the assembly hole 214b. In detail, the assembly holes 214a, 214b both have a plurality of engagement recesses 2141. In each pair of the assembly holes 214a, 214b, the engagement recesses 2141 of the assembly holes 214a are located on an inner side surface of the assembly hole 214a, where is closest to the assembly hole 214b; similarly, the engagement recesses 2141 of the assembly hole 214b are located on an inner side surface of the assembly hole 214b, where is closest to the assembly hole 214a. The bending portions 2311 of the contacting member 231 are able to be opened, so that two ends of the contacting member 231 are able to be disposed through the assembly holes 214a, 214b. After the contacting member 231 penetrates through the assembly holes 214a, 214b and is released, the bending portions 2311 of the contacting member 231 return to its original positions to press against the inner side surfaces of the assembly holes 214a, 214b, and respectively disposed the engagement recesses 2141. Accordingly, the contacting members 231 of the probe head 230 are disposed on the first pressed member 210 via a clamping manner, and it is favorable for the probe assemblies 20 to be light in weight and small in size. Furthermore, the engagement recess 2141 is favorable for fixing the contacting members 231 in place. The present disclosure is not limited to the quantities of the assembly holes 214a, 214b; in other embodiments, the quantity of the assembly holes may be two.

Figure 1E:
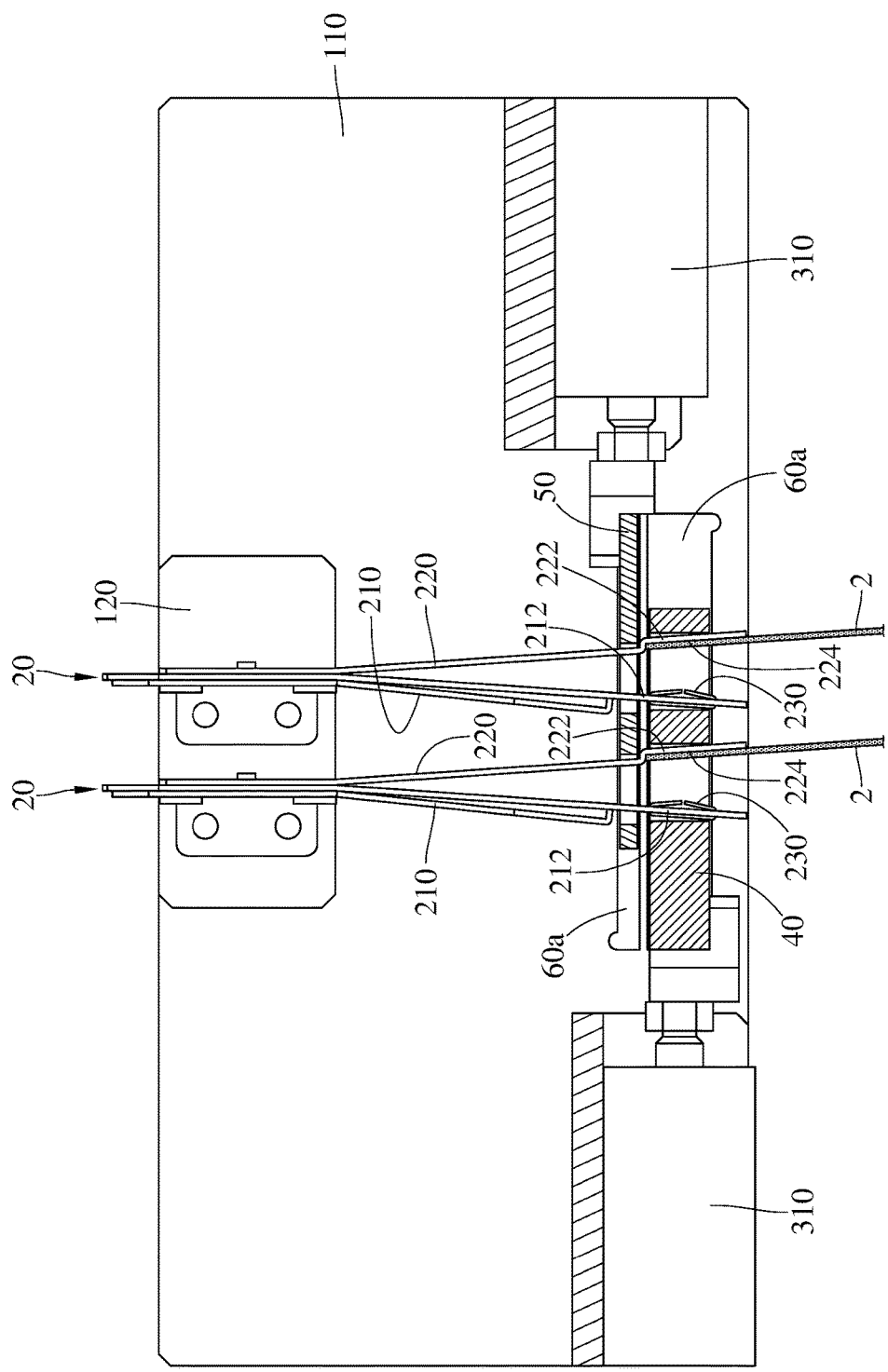
FIG. 1E is a cross-sectional view of the clamp-type probe device in FIG. 1A with two test objects respectively placed at the two pressed members.
Figure 1F:
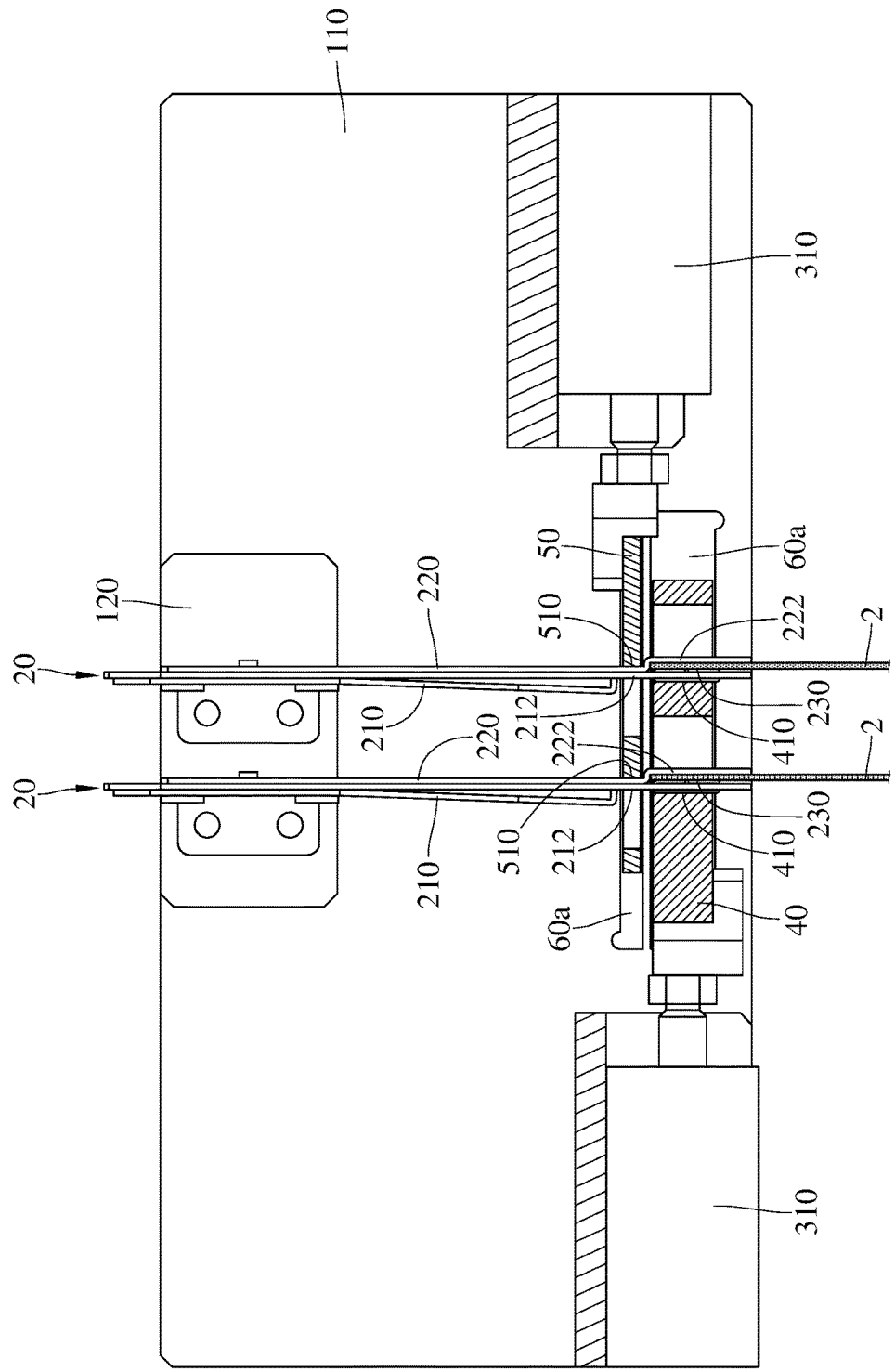
FIG. 1F is a cross-sectional view of the clamp-type probe device in FIG. 1A while clamping the test objects.

In this embodiment, when the first pressed member 210 and the second pressed member 220 of the probe assembly 20 are respectively pressed by the first pushing member 40 and the second pushing member 50, the probe head 230 disposed on the first pressed member 210 and the second clamping portion 222 of the second pressed member 220 are moved close to each other to clamp a test object for a charge/discharge test. Please refer to FIG. 1E and FIG. 1F. FIG. 1E is a cross-sectional view of the clamp-type probe device in FIG. 1A with two test objects respectively placed at the two pressed members. FIG. 1F is a cross-sectional view of the clamp-type probe device in FIG. 1A while clamping the test objects. In this embodiment, each probe assembly 20 is capable of clamping a test object 2 and conducting a charge/discharge test on the test object 2. The test object 2 is, for example, a battery electrode or a semiconductor wafer.

The method of using the clamp-type probe device 1 to test the test object 2 is described in the following paragraphs. As shown in FIG. 1E, the test object 2 is placed between the first pressed member 210 and the second pressed member 220 of the probe assembly 20 via the opening 240. In detail, the test object 2 is moved along the inclined guiding surface 224 of the second pressed member 220 from the opening 240 to be fixed between the first pressed member 210 and the second pressed member 220. At this moment, a test surface of the test object 2 (e.g., an Ohm contact, not shown in drawings) is located between the first clamping portion 212 and the second clamping portion 222. The probe head 230 faces the test surface of the test object 2, and the probe head 230 and the test surface are not in contact with each other.

Then, the power source 30 drive the first pushing member 40 and the second pushing member 50 to move in opposite directions (the first direction A and the second direction B), and then the first pressed members 210 and the second pressed members 220 are respectively pressed by the first edges 410 and the second edges 510. As shown in FIG. 1F, when the first pressed member 210 is pressed by the first pushing member 40, and the second pressed member 220 is pressed by the second pushing member 50, the probe head 230 and the second clamping portion 222 of the second pressed member 220 are moved close to each other, and a distance between the first clamping portion 212 and the second clamping portion 222 is decreased. By so doing, the test object 2 is clamped by the first clamping portion 212 and the second clamping portion 222, and the test surface of the test object 2 is fixed in place. At this moment, the probe head 230 is in contact with the test surface, so that the clamp-type probe device 1 is able to perform a charge/discharge test on the test object 2 with an electric current or voltage.

Accordingly, in this embodiment, the clamp-type probe device 1 is able to clamp the test object 2 by the first and second pushing members 40, 50 to push the first pressed member 210 and the second pressed member 220 of the probe assembly 20, respectively; furthermore, there is no additional fastening mechanism (e.g., a locking mechanism or an engagement mechanism) for the first and second pushing members 40, 50 and the probe assembly 20, such that it is favorable for simplifying the mechanism for moving the probe assembly 20, thereby minimizing the size of the clamp-type probe device 1. Moreover, it is also favorable for reducing the distance D1 between the adjacent probe assemblies 20, and therefore the clamp-type probe device 1 is capable of testing a great number of the test objects 2 at the same time, thereby increasing testing efficiency. In addition, it is possible to prevent a stress, which is generated when the first pressed member 210 and the second pressed member 220 are moved close to each other, to be transmitted to the first pushing member 40 and the second pushing member 50. Accordingly, in this embodiment, the first pushing member 40 and the second pushing member 50 are boards (e.g. a glass fiber board), which are low in cost and simple in structure, but not made of high-strength materials or not having reinforcing structures.

In this embodiment, each probe assembly 20 has the inclined guiding surface 224 located on the second pressed member 220. When users dispose the test object 2, the test object 2 is pressed against the second pressed member 220, and moved into the place between the first pressed member 210 and the second pressed member 220. The test object 2 is moved along the inclined guiding surface 224, and positioned at the place between the first pressed member 210 and the second pressed member 220. Accordingly, through the inclined guiding surface 224, users are able to move the test object 2 to press against the second pressed member 220 in order to maintain a sufficient amount of distance between the test object 2 and the probe head 230 while disposing the test object 2, thereby preventing the test surface of the test object 2 from being damaged by the probe head 230.

In addition, in this embodiment, the first pressed member 210 and the second pressed member 220 of the probe assembly 20 have the hollow structures 213, 223, which are openings. Therefore, it is favorable for increasing the flexibility of the first pressed member 210 and the second pressed member 220, thereby preventing the first pressed member 210 and the second pressed member 220 from deformation and deviation due to the stress, which is generated when the first pressed member 210 and the second pressed member 220 are pressed.

In addition, in this embodiment, the first pushing member 40 and the second pushing member 50 are disposed in the guiding grooves 60a, 60b, such that the first pushing member 40 and the second pushing member 50 are able to be moved along the guiding grooves 60a, 60b to press the probe assemblies 20. Accordingly, the guiding grooves 60a, 60b are favorable for keeping the first pushing member 40 and the second pushing member 50 moving in a predetermined path, thereby preventing displacement of the first pushing member 40 and the second pushing member 50 due to deviation from the predetermined path.

Figure 2A:
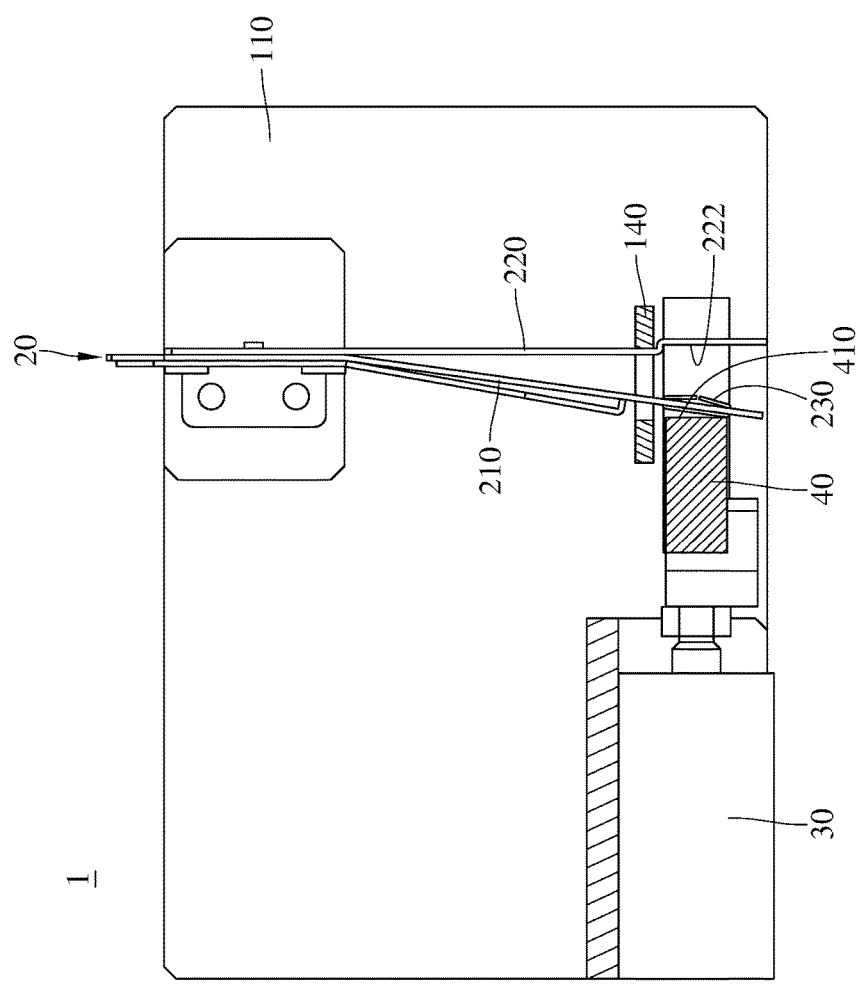
FIG. 2A is a cross-sectional view of the clamp-type probe device in accordance with a second embodiment of the disclosure.
Figure 2B:
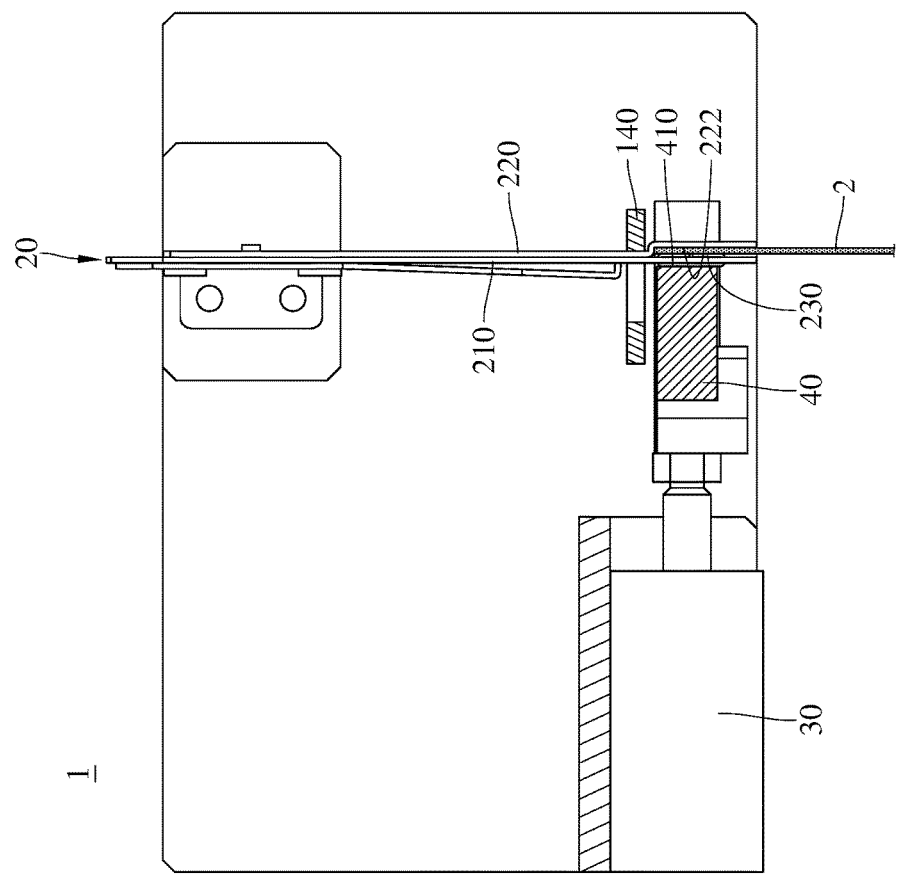
FIG. 2B is a cross-sectional view of the clamp-type probe device in FIG. 2A while clamping the test object.

In this embodiment, the first pressed member and the second pressed member of the probe head assembly are respectively pressed by two pushing members so as to clamp the test object, but the present disclosure is not limited thereto. Please refer to FIG. 2A and FIG. 2B. FIG. 2A is a cross-sectional view of the clamp-type probe device in accordance with a second embodiment of the disclosure. FIG. 2B is a cross-sectional view of the clamp-type probe device in FIG. 2A while clamping the test object. Since the second embodiment is similar to the first embodiment, only the differences between the embodiments are described in the following paragraphs.

In this embodiment, the clamp-type probe device 1 includes one pushing member 40. In addition, the base 10 further includes a supporting member 140 fixed on the carrier 110. The second pressed member 220 of the probe assembly 20 is pressed against the supporting member 140, or fixed to the supporting member 140. The power source 30 is able to move the pushing member 40 to push the first pressed member 210 with the first edge 410 so as to move the probe head 230 and the second clamping portion 222 of the second pressed member 220 close to each other. Accordingly, in this embodiment, the clamp-type probe device 1 is capable of clamping the test object 2 and performing a test on the test object 2 by only one pushing member. In addition, in this embodiment, the pushing member 40 has no through hole, such that the first edge 410 is located on a side of the pushing member 40 close to the first pressed member 210.

In this embodiment, the second pressed member 220 is fixed on the supporting member 140, and the first pressed member 210 is pressed by the pushing member 40, but the present disclosure is not limited thereto. In other embodiments, the first pressed member 210 may be fixed on the supporting member 140, and the second pressed member 220 is pressed by the pushing member.

Figure 3A:
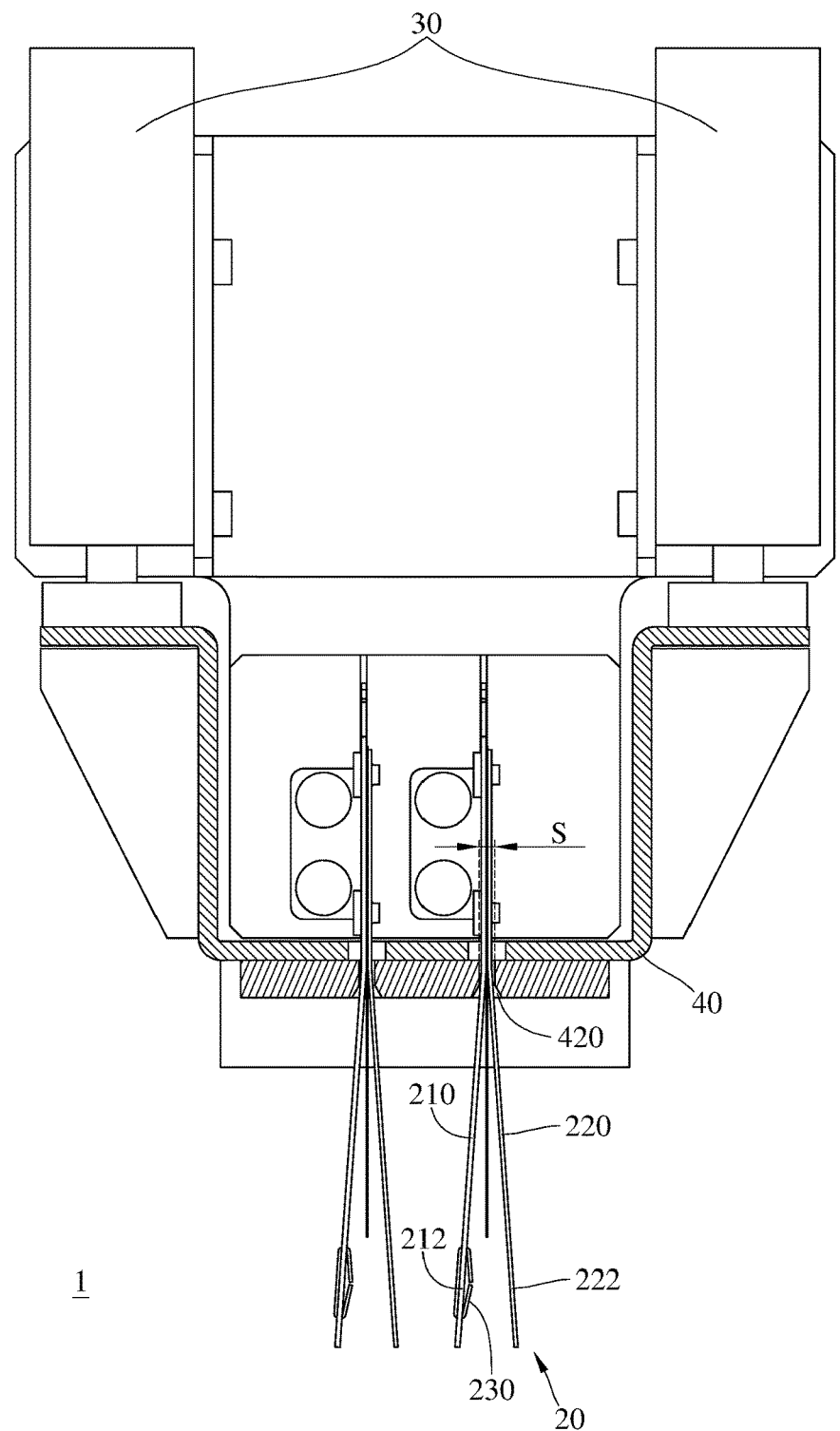
FIG. 3A is a cross-sectional view of the clamp-type probe device in accordance with a third embodiment of the disclosure.
Figure 3B:
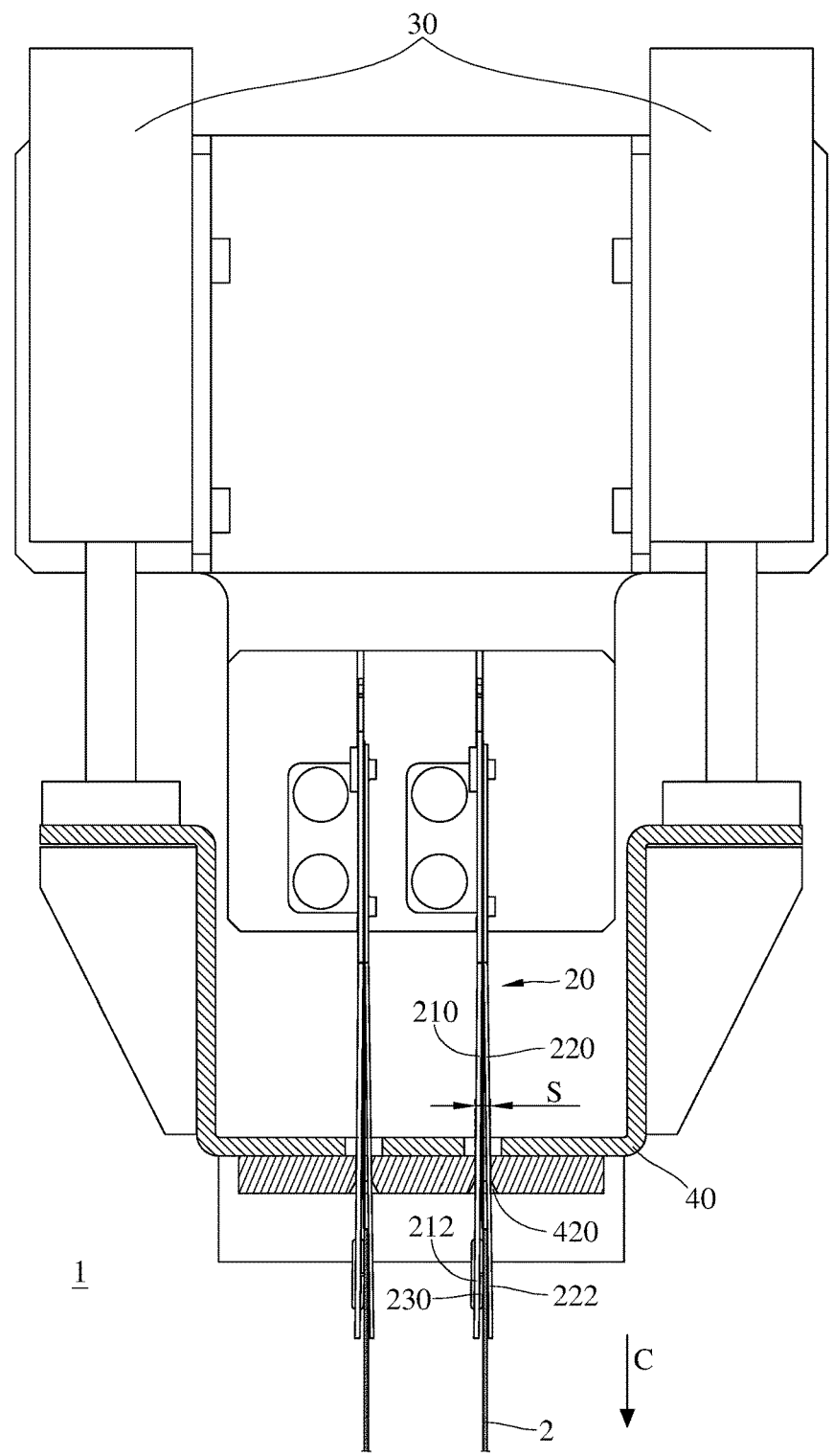
FIG. 3B is a cross-sectional view of the clamp-type probe device in FIG. 3A while clamping the test objects.

In the first embodiment and the second embodiment, the pushing members are movable in a direction perpendicular to a normal direction of the base, but the present disclosure is not limited thereto. Please refer to FIG. 3A and FIG. 3B. FIG. 3A is a cross-sectional view of the clamp-type probe device in accordance with a third embodiment of the disclosure. FIG. 3B is a cross-sectional view of the clamp-type probe device in FIG. 3A while clamping the test objects. Since the third embodiment is similar to the second embodiment, only the differences between the embodiments are described in the following paragraphs.

In this embodiment, the clamp-type probe device 1 includes one pushing member 40. The power source 30 is able to move the pushing member 40 in a third direction C, which is perpendicular to a direction where the pushing member in the second embodiment is moved. In this embodiment, a width S of the through hole 420 of the pushing member 40 is smaller than a distance between the first clamping portion 212 of the first pressed member 210 and the second clamping portion 222 of the second pressed member 220; therefore, when the pushing member 40 is moved in a direction toward the probe head 230, the first pressed member 210 and the second pressed member 220 are pressed by two opposite inner side surfaces of the through hole 420, and therefore the first clamping portion 212 and the second clamping portion 222 are moved close to each other. Accordingly, in this embodiment, the clamp-type probe device 1 is capable of clamping the test object 2 and performing a test on the test object 2 by only one pushing member.

According to the clamp-type probe device as described above, the pushing members are movable relative to the probe assemblies so as to press at least one of the first pressed member and the second pressed member. When the first pressed member and the second pressed member are respectively pressed by the first pushing member and the second pushing member, the probe head and the second clamping portion are moved close to each other. Therefore, the first clamping portion of the first pressed member and the second clamping portion of the second pressed member are capable of clamping the test object to fix the test surface of the test object in place together. At this moment, the probe head is in contact with the test surface, and the clamp-type probe device is able to perform a charge/discharge test on the test object with an electric current or voltage. The clamp-type probe device of the present disclosure is able to clamp the test object by the probe assembly and perform a charge/discharge test on the test object by the pushing members pressing the pressed members of the probe assembly; furthermore, there is no additional fastening mechanism (e.g., a locking mechanism or an engagement mechanism) for the pushing members and the probe assembly, such that it is favorable for simplifying the mechanism for operating the probe assembly, thereby minimizing the size of the clamp-type probe device. Moreover, it is also favorable for reducing the distance between the adjacent probe assemblies; therefore, the clamp-type probe device is capable of testing a great number of the test objects at the same time, thereby increasing testing efficiency. In addition, it is possible to prevent a stress, which is generated when the first pressed member and the second pressed member are moved close to each other, to be transmitted to the pushing member. Accordingly, the pushing members are boards, which are low in cost and simple in structure, but not made of high-strength materials or not having reinforcing structures.

In addition, each of the contacting members of the probe head includes two bending portions, and the first pressed member has a plurality of assembly holes. Each of the contacting members is disposed through one of the pairs of the assembly holes, and the two bending portions are respectively pressed against the inner side surfaces of the one pair of the assembly holes. Accordingly, the contacting members of the probe head are disposed on the first pressed member via a clamping manner, and it is favorable for the probe assembly to be light in weight and small in size.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A clamp-type probe device, comprising:
a first pressed member comprising a first clamping portion and a first mounted portion connected to each other, and the first pressed member having a first assembly hole and a second assembly hole;
a second pressed member comprising a second clamping portion and a second mounted portion connected to each other, the second mounted portion and the first mounted portion connected to each other, and the second clamping portion and the first clamping portion separated from each other; and
a probe head comprising a plurality of contacting members, each of the plurality of contacting members comprising two bending portions connected to each other, two ends of each of the plurality of contacting members, which are opposite to each other, respectively disposed through the first assembly hole and the second assembly hole, and the two bending portions of each of the plurality of contacting members respectively pressed against an inner side surface of the first assembly hole and an inner side surface of the second assembly hole.

2. The clamp-type probe device according to claim 1, further comprising:
a base;
a first pushing member movably disposed on the base, and the first pushing member having a first edge; and
a second pushing member movably disposed on the base, and the second pushing member having a second edge;
wherein, the first pushing member and the second pushing member are movable relative to each other, the first pushing member is able to push the first pressed member with the first edge, and the second pushing member is able to push the second pressed member with the second edge; when the first pressed member and the second pressed member are respectively pushed by the first pushing member and the second pushing member, the probe head and the second clamping portion are moved close to each other.

3. The clamp-type probe device according to claim 2, wherein the base comprises a carrier and an electrically insulating member, the electrically insulating member is fixed to the carrier, and the first pressed member and the second pressed member are fixed to the carrier through the electrically insulating member.

4. The clamp-type probe device according to claim 2, wherein the first pushing member is movable in a first direction to push the first pressed member, and the second pushing member is movable in a second direction, which is opposite from the first direction, to push the second pressed member.

5. The clamp-type probe device according to claim 2, wherein the first pushing member has a first through hole, the second pushing member has a second through hole, the first edge is located in the first through hole, the second edge is located in the second through hole, and the first pressed member and the second pressed member are disposed through the first through hole and the second through hole.

6. The clamp-type probe device according to claim 2, further comprising a power source disposed on the base, wherein the first pushing member and the second pushing member are connected to the power source, and the power source is able to move the first pushing member and the second pushing member.

7. The clamp-type probe device according to claim 2, further comprising two guiding grooves disposed on the base, and the first pushing member and the second pushing member respectively disposed in the two guiding grooves.

8. The clamp-type probe device according to claim 1, wherein each of the first assembly hole and the second assembly hole has a plurality of engagement recesses located on the inner side surface thereof, and the plurality of contacting members are partially disposed in the plurality of engagement recesses, respectively.

9. The clamp-type probe device according to claim 1, further comprising:
a base; and
a pushing member movably disposed on the base, the pushing member being movable to push at least one of the first pressed member and the second pressed member, so as to move the probe head and the second clamping portion close to each other.

10. The clamp-type probe device according to claim 9, wherein the pushing member has a through hole, the first pressed member and the second pressed member are disposed through the through hole; when the pushing member is moved, two sides of the through hole, which are opposite to each other, respectively push the first pressed member and the second pressed member.

* * * * *